(12) United States Patent
Izumi

(10) Patent No.: US 7,462,863 B2
(45) Date of Patent: Dec. 9, 2008

(54) THIN FILM PHOTOTRANSISTOR, ACTIVE MATRIX SUBSTRATE USING THE PHOTOTRANSISTOR, AND IMAGE SCANNING DEVICE USING THE SUBSTRATE

(75) Inventor: Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 829 days.

(21) Appl. No.: 10/509,629

(22) PCT Filed: Jul. 3, 2003

(86) PCT No.: PCT/JP03/08509

§ 371 (c)(1),
(2), (4) Date: Sep. 29, 2004

(87) PCT Pub. No.: WO2004/008539

PCT Pub. Date: Jan. 22, 2004

(65) Prior Publication Data

US 2005/0179964 A1    Aug. 18, 2005

(30) Foreign Application Priority Data

Jul. 11, 2002    (JP)    ............................. 2002-202960

(51) Int. Cl.
    *H01L 29/04* (2006.01)
(52) U.S. Cl. .................................................. 257/59
(58) Field of Classification Search .................. 257/59, 257/72, 359, E51.005
    See application file for complete search history.

(56) References Cited

U.S. PATENT DOCUMENTS 6,600,160 B2 *    7/2003    Kobayashi et al. ..... 250/370.14

| | | | |
|---|---|---|---|
| 6,674,495 B1 * | 1/2004 | Hong et al. | 349/43 |
| 6,794,682 B2 * | 9/2004 | Watanabe et al. | 257/72 |
| 2005/0045889 A1 * | 3/2005 | Fryer et al. | 257/72 |
| 2005/0067618 A1 * | 3/2005 | Nakajima et al. | 257/59 |

FOREIGN PATENT DOCUMENTS

| JP | 2-8055 U | 1/1990 |
|---|---|---|
| JP | 2-215168 A | 8/1990 |
| JP | 4-330783 A | 11/1992 |
| JP | 5-243547 A | 9/1993 |
| JP | 6-132510 A | 5/1994 |
| JP | 6-140614 A | 5/1994 |
| JP | 7-326791 A | 12/1995 |

OTHER PUBLICATIONS

International Preliminary Examination Report mailed Jan. 22, 2004 in corresponding PCT Application No. PCT/JP03/008509.
International Search Report mailed Oct. 7, 2003 in corresponding PCT Application No. PCT/JP03/008509.

* cited by examiner

*Primary Examiner*—Nathan W Ha
(74) *Attorney, Agent, or Firm*—Nixon & Vanderhye P.C.

(57) ABSTRACT

A gate insulation film (14) and a semiconductor layer (15) are laminated on a gate electrode (13); and a source electrode (17) and a drain electrode (18) are formed on the semiconductor layer (15) by having a predetermined interval between their end portions. Each of the source electrode (17) and the drain electrode (18) includes a superimposition area (17*a* and 18*a*), and at least one portion of the superimposition area (17*a* and 18*a*) has translucency. This arrangement realizes improvement of photosensitivity (Ip/Id) without causing complication of wiring layout or manufacturing process.

13 Claims, 13 Drawing Sheets

THIN FILM PHOTOTRANSISTOR, ACTIVE MATRIX SUBSTRATE USING THE PHOTOTRANSISTOR, AND IMAGE SCANNING DEVICE USING THE SUBSTRATE

This application is the US national phase of international application of PCT/JP2003/008509 filed 3 Jul. 2003 which claims priority of JP 2002-202960 filed Jul. 11, 2002, the entire contents of which are hereby incorporated by reference.

TECHNICAL FIELD

The present invention relates to an image scanning device capable of scanning an image such as a document or a photo, and in particular to a flat-panel image scanning device using an active matrix substrate including a thin film phototransistor.

BACKGROUND ART

In recent years, a flat-bed scanner as a close-contact-type image scanning device for scanning documents and/or photos has been pervasive. The flat-bed scanner is capable of scanning a two-dimensional image by carrying out line scanning (Y direction) with a line sensor (such as a CCD line sensor) having pixels aligned in a linear pattern (X direction).

However, the scanner with such a line sensor is limited in terms of its reduction in thickness and weight due to a scanning mechanism provided for scanning a two-dimensional image, and therefore, it has some difficulties of improvement of scanning speed.

Therefore, in order to realize reduction in thickness and weight, and increase of scanning speed, an active matrix-type two-dimensional image sensor (an image scanning device) has been created. This active matrix two-dimensional image sensor is arranged so that a photo-sensing element (a photodiode, a phototransistor) and a switching element (such as a thin film transistor) are aligned in a two-dimensional manner.

This two-dimensional image sensor allows two-dimensional image scanning without using a scanning mechanism, and therefore, the thickness, the weight can be reduced to less than 1/10, and the scanning speed can be accelerated to more than 10 times, compared to the "flat bed scanner" using a conventional CCD line sensor, thus realizing an easy-to-use image scanning device.

Active matrix image scanning devices disclosed in Japanese Laid-Open Patent Application Jitsukaihei 02-8055/1990 (published on Jan. 18, 1990) and Japanese Laid-Open Patent Application Tokukaihei 05-243547/1993 (published on Sep. 21, 1993) may be examples having such a configuration.

As shown in FIG. 12, an active matrix array (an active matrix substrate) used in a conventional active matrix image scanning device is arranged so that the pixels are aligned in a XY matrix manner, and each pixel includes a thin film transistor for photo-detection (hereinafter referred to as a photosensor TFT), a switching thin film transistor (hereinafter referred to as a switching TFT) and a pixel capacitor (charge accumulation capacitor).

The respective photo-sensors TFT of the pixels differ to each other in charge amount accumulated in the accumulation capacitor of each pixel (or discharged from the accumulation capacitor) due to difference of the magnitude of photo-current Ip which varies according to the ratio of white to black (lightness and darkness) of the object such as a document surface. The switching TFT sequentially reads charge amount distribution (in-plane distribution) of each accumulation capacitor so as to obtain two-dimensional information of the object.

In such an active matrix image scanning device, improvement in performance of photo-sensor TFT allows scanning of the object even with a weak reference beam. More specifically, even with a low-illuminance backlight, a sufficient value can be ensured for the photo-current, thus realizing reduction of power consumption.

Further, with this arrangement, it also becomes possible to reduce time constant of charging/discharging of accumulation capacitor in the light irradiation section (not shown), and this allows high-speed scanning. Thus, some melioration has been conventionally attempted for increasing the ratio of the photo-current to the dark current, i.e., photosensitivity (Ip/Id) of a photo-sensor TFT.

For example, Japanese Laid-Open Patent Application Tokukaihei 05-243547 (Prior art 1) discloses a method for increasing the photo-current Ip upon irradiation by providing thickness difference between a gate insulation film of the photo-sensor TFT and a gate insulation film of the switching TFT, so as to improve the photosensitivity (Ip/Id). As an example of this configuration, FIG. 13 shows a configuration in which the thickness H1 of the gate insulation film of the photo-sensor TFT and the thickness H2 of the gate insulation film of the switching TFT are in a relation of H1>H2 by setting the thickness H1 to be equal to the total thickness of the first gate insulation film and the second gate insulation film, and setting the thickness H2 to be equal to the thickness of the second gate insulation film. In such a manner, this configuration provides different thickness between the gate insulation film of the photo-sensor TFT and the gate insulation film of the switching TFT.

Further, Japanese Laid-Open Patent Application Tokukaihei 02-215168 (Published on Aug. 28, 1990) and Japanese Laid-Open Patent Application Tokukaihei 06-132510 (Prior art 2: Published on May 13, 1994) disclose a configuration in which plural gate electrodes are provided in the photo-sensor TFT so as to carry out light absorption in an area less influenced by the gate voltage, on purpose to increase the ratio of the high photo-current Ip to the low dark current Id, i.e., photosensitivity (Ip/Id). For example, FIG. 14 shows another configuration for increasing the ratio of the photo-current to the dark current, i.e., photosensitivity (Ip/Id) of a photo-sensor TFT. In this arrangement, each photo-sensor TFT has two gate electrodes so as to provide on an amorphous silicon layer a light absorption area A which corresponds to a contact hole formed between the drain electrode and a source electrode.

However, though the foregoing Prior art 1 and Prior art 2 both are capable of increasing photosensitivity (Ip/Id), they still have the following problems.

Prior art 1 causes complication of manufacturing process of the TFT since the gate insulation film of the switching TFT and the gate insulation film of the switching TFT have to be made in different thickness.

Further, Prior art 2 causes difficulties of scanning for a high-definition image since provision of plural gate electrodes complicates the wiring layout for each pixel.

Therefore, the present invention provides an active matrix substrate including a photo-sensor TFT which can realize improvement of photosensitivity (Ip/Id) with a simpler structure. Further, the present invention is aimed at realizing a high-performance image scanning device capable of high-speed scanning with low power consumption (with a low-illuminance backlight).

Accordingly, the present invention is made in view of the foregoing problems, and an object is to provide a thin film phototransistor which can be used as a photo-sensor TFT capable of increasing photosensitivity (Ip/Id) without causing complication of manufacturing process or wiring layout, and to provide an active matrix substrate using the thin film transistor, and an image scanning device using the active matrix substrate.

DISCLOSURE OF INVENTION

In order to solve the foregoing problems, a thin film phototransistor according to the present invention includes: a gate electrode; a gate insulation film provided on the gate electrode; a photosensitive semiconductor film laminated on the gate insulation film; a source electrode provided on the photosensitive semiconductor film; and a drain electrode provided on the photosensitive semiconductor film, an end portion of the source electrode and an end portion of the drain electrode being separated with a predetermined distance, the source electrode and the drain electrode including a superimposition area for being horizontally superimposed on the gate electrode, and the superimposition area including at least one portion having translucency.

With the foregoing arrangement, since the superimposition area of the source electrode and/or the drain electrode for being horizontally superimposed on the gate electrode including at least one portion having translucency, light irradiation quantity on the gate electrode is increased. More specifically, the photosensitive semiconductor film is irradiated with the light from the areas having translucency of the source electrode and the drain electrode as well as the light from the gap between the respective end portions of the source electrode and the drain electrode.

On this account, the photo-current (Ip) can be increased, and therefore photosensitivity (Ip/Id), which is found by the ratio of the photo-current to the dark current (Id), can be increased.

Further, the foregoing configuration does not require a complicated wiring, as it is realized only by providing translucency to a portion of the source electrode and the drain electrode. Also, the existing manufacturing process of the thin film transistor can be used without changes.

Therefore, the foregoing configuration of a thin film transistor realizes improvement of photosensitivity (Ip/Id) without causing complication of wiring layout or manufacturing process.

For example, when having the same size thin film phototransistor, photosensitivity will be increased as thus described, and therefore time constant for charging (or discharging) of the accumulation capacitor upon light irradiation can be reduced. As a result, scanning speed can be increased.

Further, when the phototransistor requires the same photosensitivity level as the conventional configuration, the size of the thin film phototransistor itself can be reduced, and therefore, pixel density of the active matrix substrate having the thin film transistor can be increased, thus realizing high-definition active matrix substrate.

Additional objects, features, and strengths of the present invention will be made clear by the description below. Further, the advantages of the present invention will be evident from the following explanation in reference to the drawings.

BEST MODE FOR CARRYING OUT THE INVENTION

Embodiment 1

The following will explain one embodiment of the present invention. Note that, the present embodiment uses a two-dimensional image sensor as an image scanning device.

Figure 2:
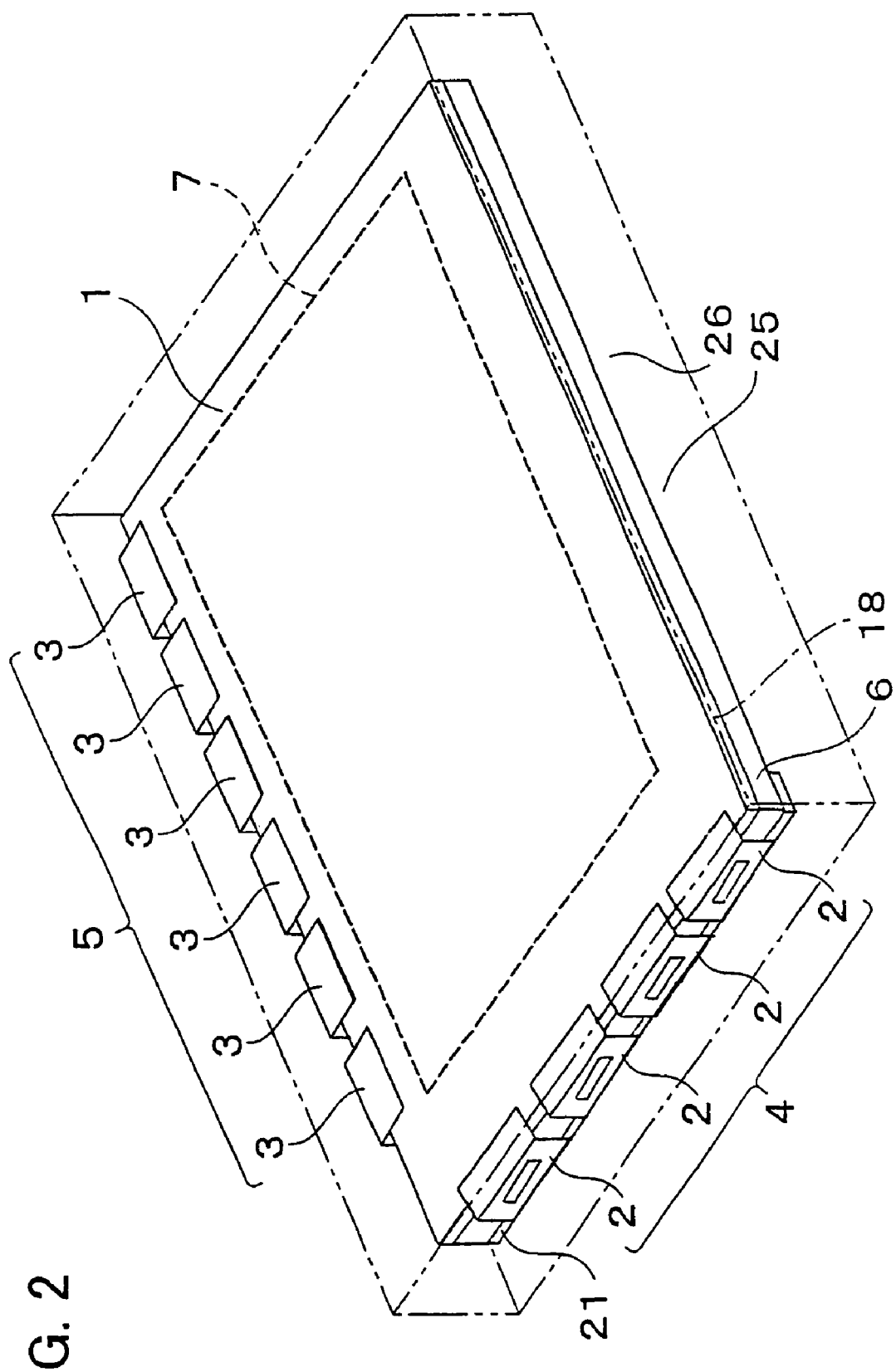
FIG. 2 is a perspective view schematically showing an image scanning device including the thin film phototransistor shown in FIG. 1.

The following will describe the two-dimensional image sensor according to the present embodiment with reference to FIG. 2. FIG. 2 is a cross-sectional view schematically showing the two-dimensional image sensor.

As shown in FIG. 2, the two-dimensional image sensor is constituted of an active matrix substrate 1 as a sensor substrate, a driving circuit 4 including plural driving ICs 2 and a reading circuit 5 including plural reading ICs 3 for driving the active matrix substrate 1, and a backlight unit 6 as light irradiation means for irradiating the active matrix substrate 1 with light from the back side of the substrate.

The active matrix substrate 1 has a transparent protection film 7 for protecting its surface. The protection film 7 is formed on a surface on which a document is placed.

Figure 3:
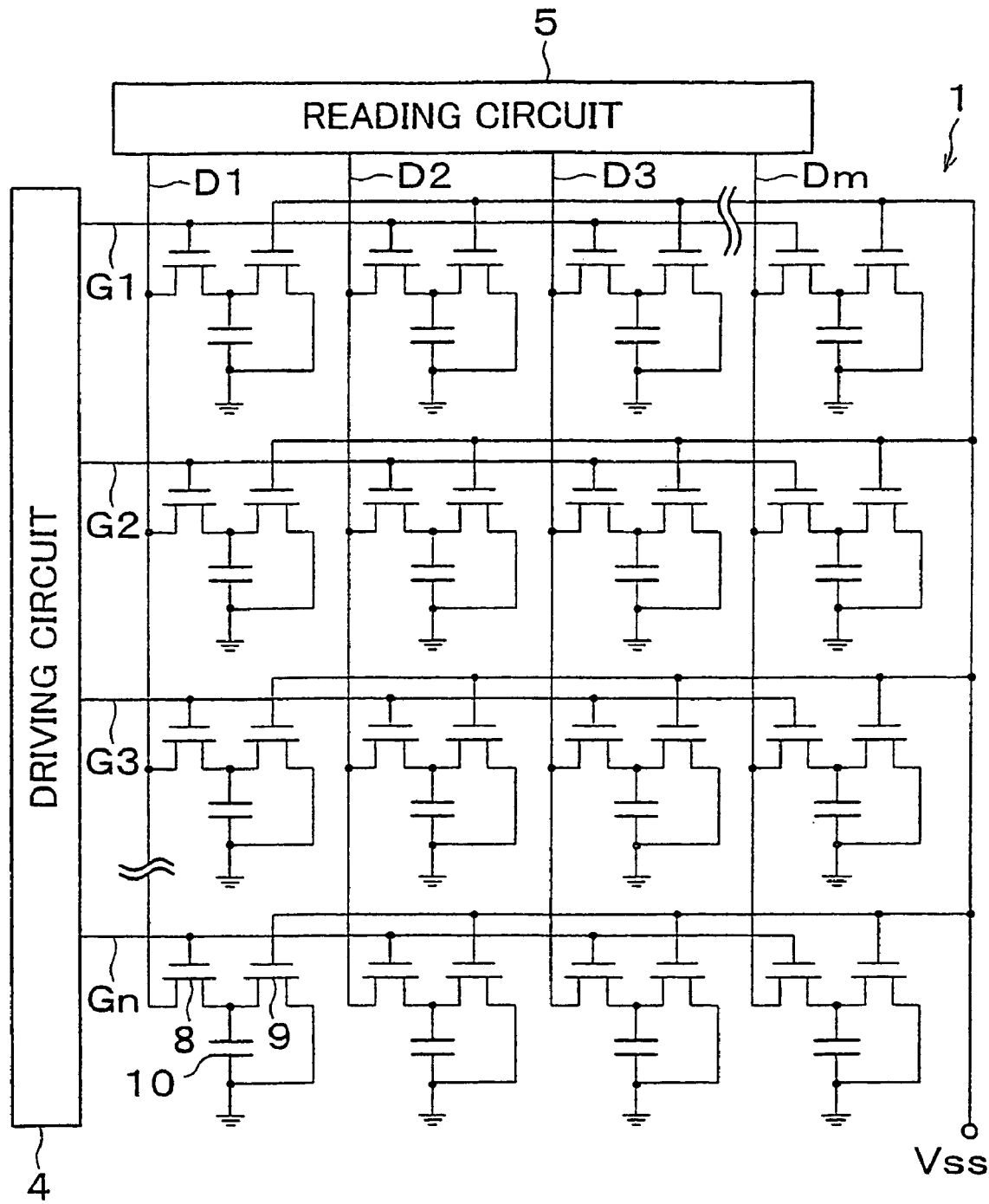
FIG. 3 is a block diagram schematically showing an active matrix substrate having the thin film phototransistor shown in FIG. 1.

The following will explain the details of the active matrix substrate 1 with reference to FIG. 3. FIG. 3 is a block diagram schematically showing the active matrix substrate 1.

Figure 12:
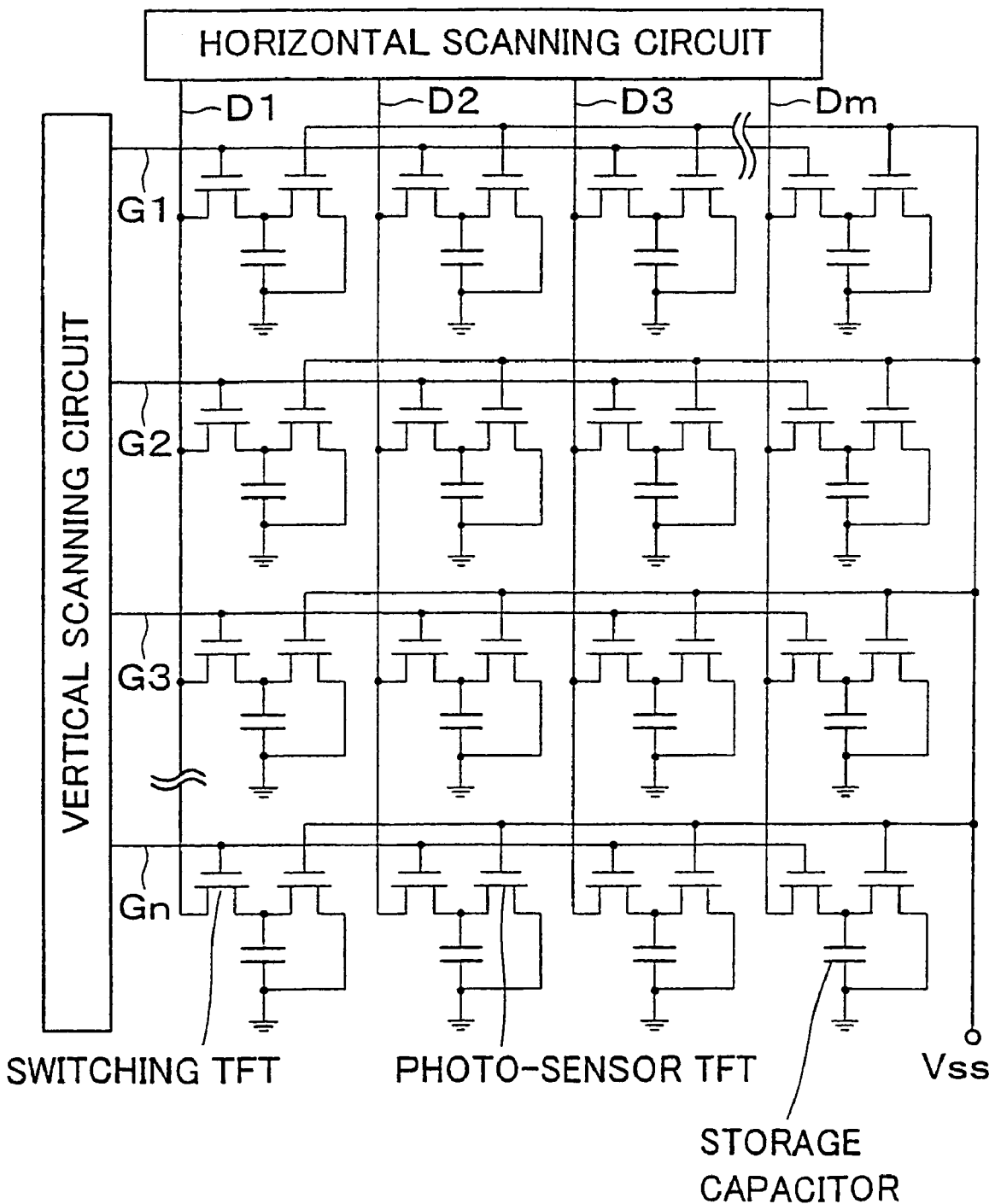
FIG. 12 is a block diagram schematically showing an active matrix substrate including a conventional photo-sensor TFT and switching TFT.
Figure 13:
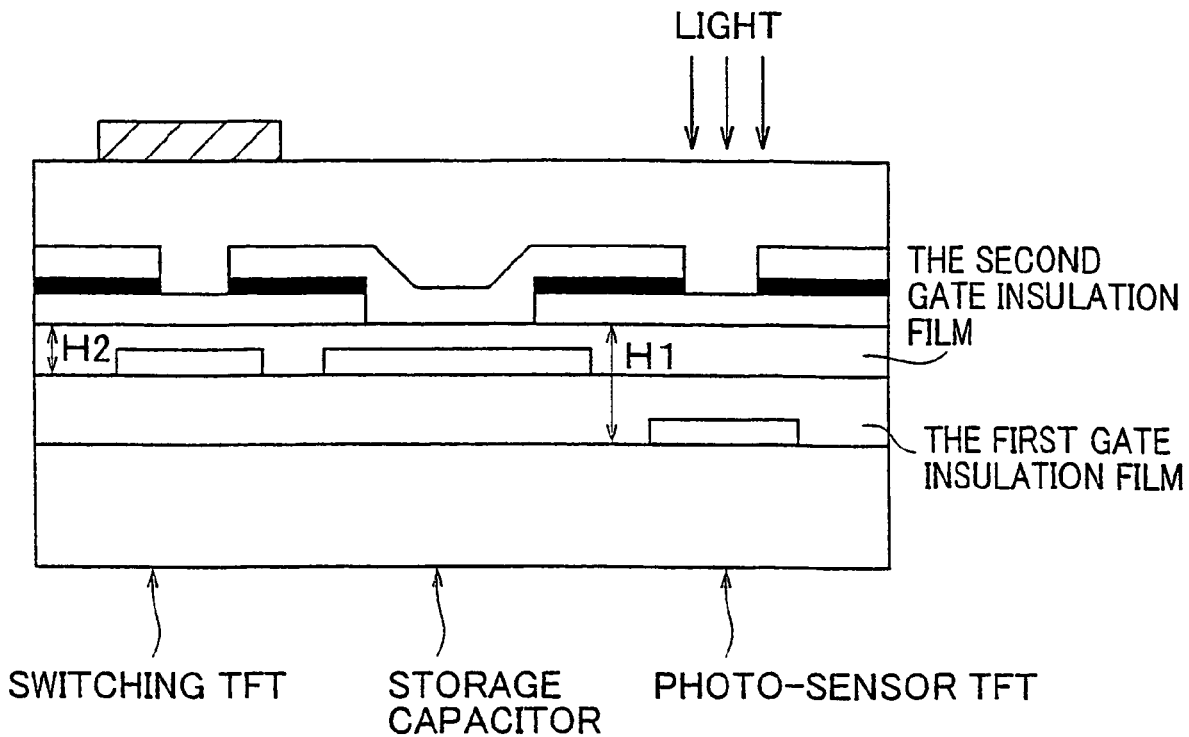
FIG. 13 is a cross-sectional view schematically showing a pixel arrangement of the active matrix substrate shown in FIG. 12.
Figure 14:
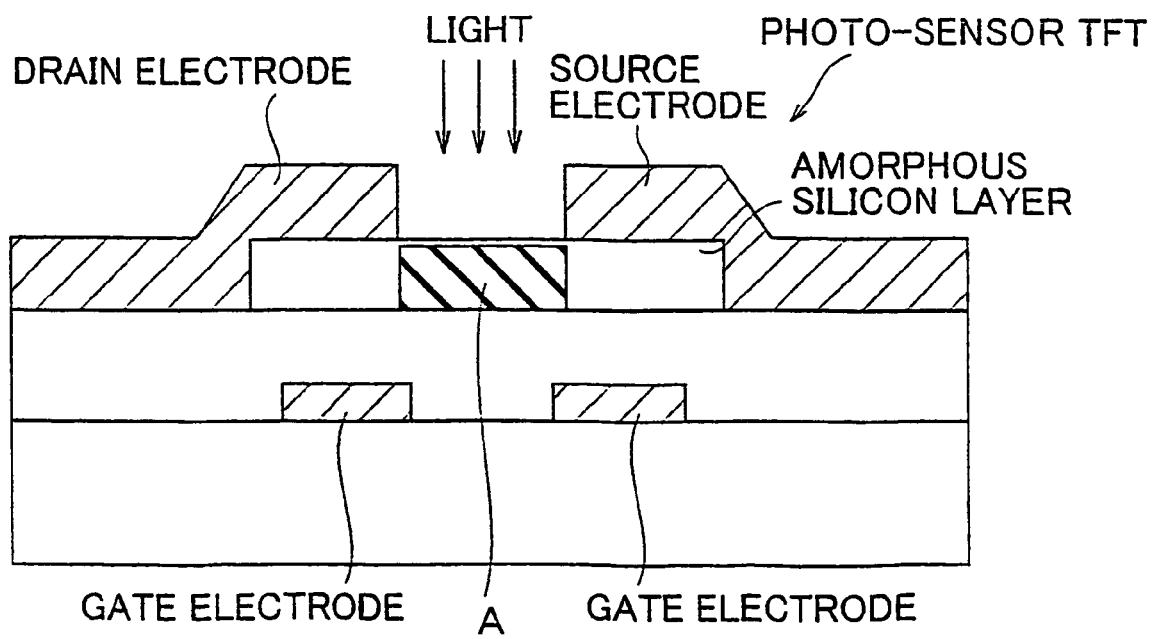
FIG. 14 is a cross-sectional view schematically showing an arrangement of a conventional photo-sensor TFT.

The active matrix substrate 1 has the same circuit structure as that of the conventional active matrix image scanning device shown in FIG. 12.

More specifically, as shown in FIG. 12, the active matrix substrate 1 includes gate wirings G1 through Gn which are electric wirings extending from the driving circuit 4, and source wirings D1 through Dm which are electric wirings extending from the reading circuit 5. The gate wirings G1 through Gn and the source wirings D1 through Dm are aligned in a XY matrix manner (in a lattice pattern) in which the pixels are sectioned by the respective squares. Each pixel includes a switching thin film transistor (hereinafter referred to as a switching TFT) 8, a photo-sensing thin film transistor as a thin film photo-transistor (hereinafter referred to as a photo-sensor TFT) 9, and a pixel capacitor 10 as a charge accumulation capacitor.

The following will explain a basic operation principle of the active matrix substrate 1.

Firstly, the photo-sensor TFT 9 of each pixel is set in an OFF state by applying a predetermined bias voltage (Vss) so that a dark current Id is kept in low. When the photo-sensor TFT 9 under this circumstance is irradiated with external light, a photoexcitation carrier is generated in its channel section, and the resistance value of the photo-sensor TFT 9 decreases. This change of resistance value of the photo-sensor TFT 9 causes difference of a current (a photo-current Ip) flowing between the source and the drain of the photo-sensor TFT 9, i.e., difference of charge amount in each photo-sensor TFT 9. This results in difference of charging amount (or discharging amount) of the pixel capacitor 10 connected to each photo-sensor TFT 9.

Therefore, the charge amount accumulated in the respective pixel capacitors 10 can be read out via the source wirings D1 through Dm by sequentially turning on the switching TFTs 8 provided on the respective pixels. This operation provides plane distribution information of charge amount in the respective pixel capacitors 10, thereby obtaining plane distribution information of the image formed by the light irradiation to the active matrix substrate 1.

The active matrix substrate 1 including such pixels are further provided on the front surface with the protection film 7 (or a protection substrate) as shown in FIG. 2, and also provided on the rear surface with the backlight unit 6 made of a planar illuminant (a backlight made of an LED or a cold-cathode tube). With this arrangement, by placing an object document such as a photo on the surface (on the side having the protection film 7) of the active matrix substrate 1, a two-dimensional image sensor as a two-dimensional image scanning device can be realized.

Figure 4:
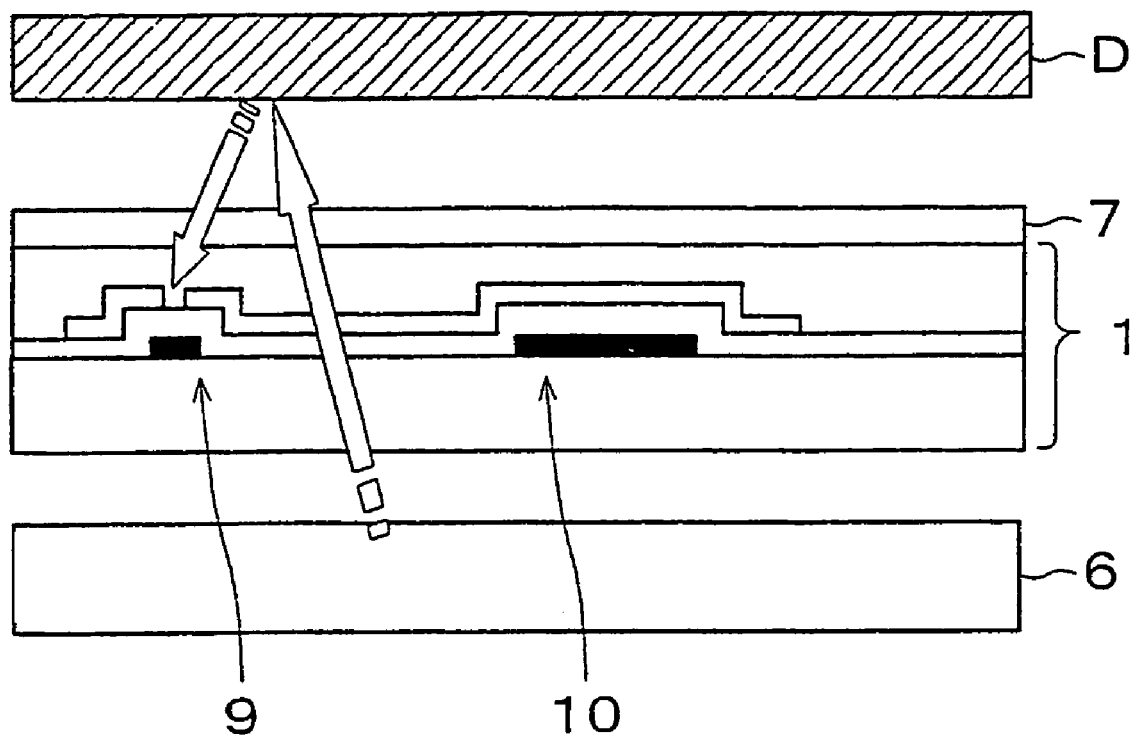
FIG. 4 is a cross-sectional view schematically showing a structure of a panel included in the image scanning device shown in FIG. 2.

The following will explain the operation of the two-dimensional image sensor with reference to FIG. 4. FIG. 4 is a drawing showing a document scanning state when a document D is placed on the two-dimensional image sensor. Note that, for ease of explanation, the switching TFT 8 is omitted in the figure.

In the two-dimensional image sensor, the light emitted from the backlight unit 6 passes through the opening section of the active matrix substrate 1, and is incident onto the surface of the document D, i.e., a scanning object, as shown in FIG. 4. The light reached to the document surface is reflected according to image information in the document surface, and then this reflection light reaches to the photo-sensor TFT 9 of the active matrix substrate 1.

This two-dimensional image sensor using the active matrix substrate 1 does not include a scanning mechanism for scanning two-dimensional images, and therefore, in comparison with a conventional scanner using a line sensor, this image scanner allows reduction in thickness and weight and also allows faster scanning speed.

Figure 1:
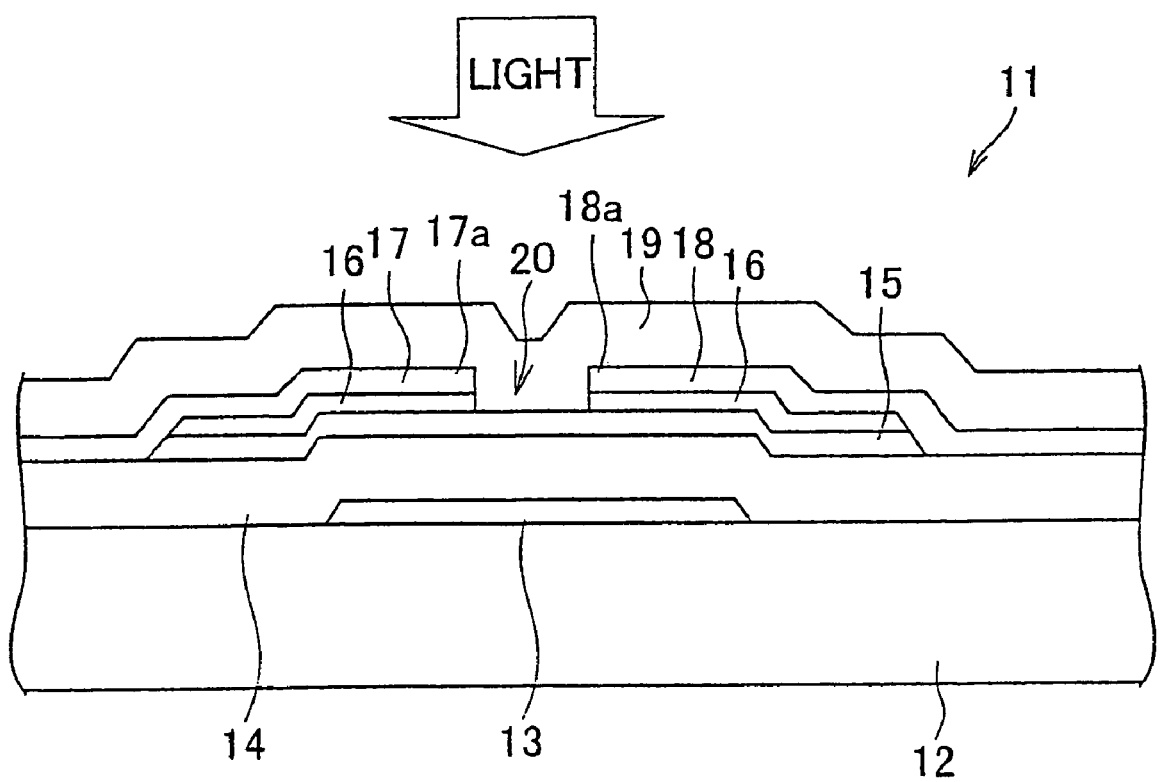
FIG. 1 is a cross-sectional view schematically showing an arrangement of a thin film phototransistor as an example of the present invention.

Next, with reference to FIG. 1, the following will explain a structure of the photo-sensor TFT 9 provided in the foregoing active matrix substrate 1. Note that, here, the switching TFT 8 provided in the active matrix 1 may have the same configuration as that of the conventional one, and therefore the explanation thereof is omitted here.

FIG. 1 is a cross-sectional view schematically showing an arrangement of a photo-sensor TFT 11 as a suitable structure example for the thin film phototransistor of the present invention.

As shown in FIG. 1, the photo-sensor TFT 11 includes a gate electrode 13 on a substrate 12 made of a glass or the like. The gate electrode 13 is constituted of an electrode divided from a part of the gate wirings G1 through Gn, or from the gate wirings G1 through Gn, which are shown in FIG. 3.

The gate electrode 13 needs to be constituted by a metal film (a film made of such as Al, Ta, Mo, or Ti; the thickness is around 0.1 to 0.4 μm) to have a function as a light-blocking film. With this light-blocking function, the light directly incident from the rear surface of the active matrix substrate 1 is not incident onto the channel section of the photo-sensor TFT 11.

Further, a gate insulation film (an insulator of such as SiNx, $SiO_2$; the thickness is around 0.3 to 0.5 μm) is formed on the gate electrode 13. Further, a semiconductor layer (a semiconductor of such as a-Si, poly-Si; the thickness is around 0.05 to 0.2 μm) 15 as a photosensitive semiconductor film is formed on the gate insulation film 14. This photosensitive semiconductor film operates as the channel section described above.

Further, a contact layer 16 (a semiconductor of such as a-Si of n+; the thickness is around 0.01 to 0.05 μm), a source electrode 17 and a drain electrode 18 are formed on the semiconductor layer 15. Here, the present invention uses an ITO (Indium Tin Oxide; the thickness is around 0.1 to 0.3 μm) having a superior translucency as the material of the source electrode 17 and the drain electrode 18. Note that, other existing transparent conductive oxide films such as an IZO (Indium Zinc Oxide) or an IGO (Indium Germanic Oxide) may be used instead of ITO. Further, $SnO_2$, ZnO, or a conductive organic film may also be used. Since it is allowed to use these existing transparent conductive oxide films, the translucent areas of the source electrode and the drain electrode can be easily formed without a complicated manufacturing process.

In such a manner, the basic configuration of the photo-sensor TFT 11 is completed.

Then, finally, a protection film (such as SiNx) 19 is formed by covering the whole of the photo-sensor TFT 11.

The characteristic of the present invention is the use of a transparent conductive film having a superior translucency for the materials of the source electrode 17 and the drain electrode 18 of the photo-sensor TFT 11. In a conventional technology, when the source electrode 17 and the drain electrode 18 are made of a metal film, the light irradiated onto the top of the active matrix substrate 1 only reaches to a small gap (a gap section 20) formed between the source/drain electrodes in the channel section, i.e., the semiconductor layer 15, since the source electrode 17 and the drain electrode 18 operate as a light blocking film. Therefore, generation of the photoexcitation carrier is limited in the semiconductor layer 15, thus interfering improvement of sensitivity.

On the other hand, in the photo-sensor TFT 11 of the present invention, the irradiation light reaches to the semiconductor layer 15 as the channel section also in a superimposition area 17*a* where the source electrode 17 is horizontally superimposed on the gate electrode 13, and/or a superimposition area 18*a* where the drain electrode 18 is horizontally superimposed on the gate electrode 13. Thus, the area for generating the photoexcitation carrier can be widened.

As a result, the photo-sensor TFT 11 of the present invention can increase the photo-current Ip greater than that of a conventional photo-sensor TFT. Meanwhile, when there is no light irradiation, the dark current Id can be kept in the same level as that of the conventional photo-sensor. Accordingly, the photo-sensor TFT 11 of the present invention can improve sensitivity (Ip/Id) with respect to light.

Figure 5:
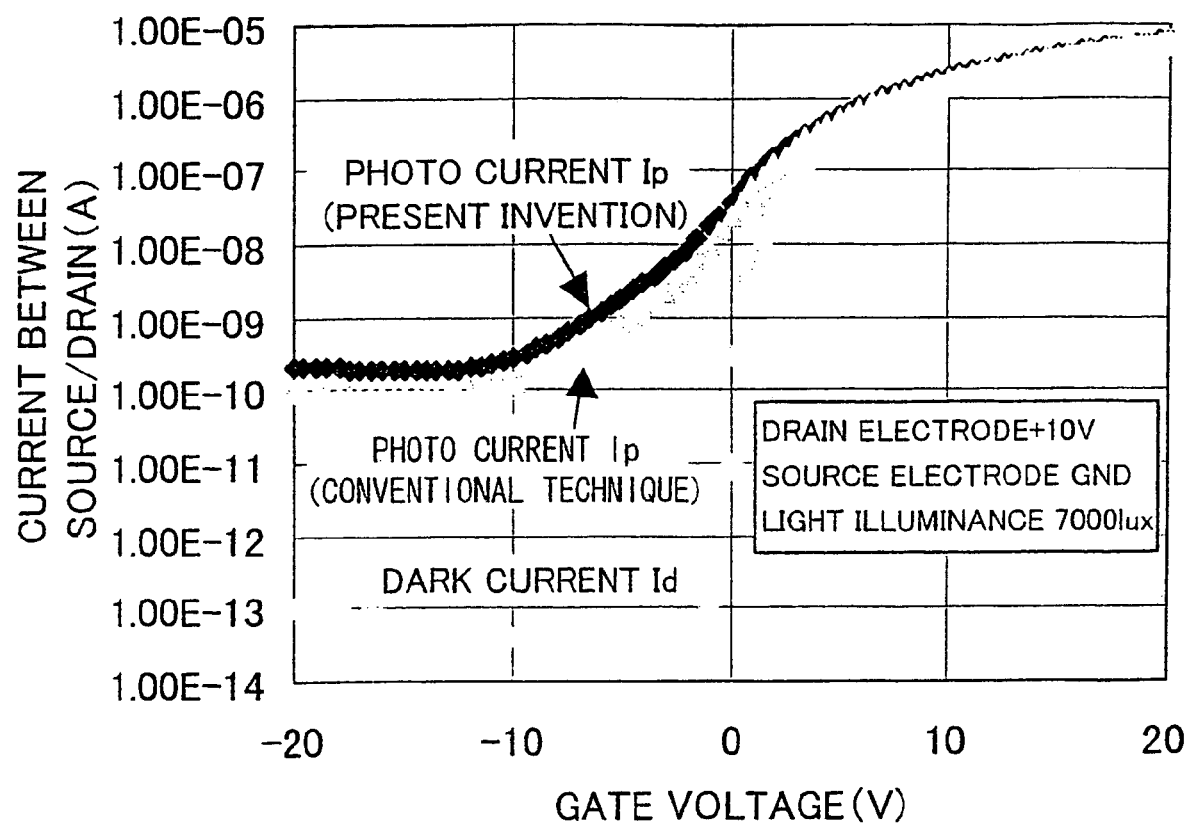
FIG. 5 is a graph showing comparison of sensitivity of the thin film phototransistor of the present invention.

Here, the following will explain a sensitivity characteristic of the thin film phototransistor of the present invention with reference to FIG. 5. FIG. 5 is a graph showing comparison between the sensitivity characteristic of a conventional photo-sensor TFT and the sensitivity characteristic of the photo-sensor TFT as the thin film phototransistor of the present invention.

Note that, in the graph, the comparison between the respective photo-currents Ip and the respective dark currents Id are performed on the condition that the size ratio (L/W) of the channel section of each TFT is $5/15$, the drain electrode is +10V, and the source electrode is GND. Further, the measurement of the photo-current Ip is carried out under the circumstance of 7000 lux illuminance.

The graph shown in FIG. 5 shows that there is no difference between the respective dark currents Id; however, the photo-current Ip of the photo-sensor TFT of the present invention is increased to be about twice (at the point where the gate is −10V) of that of the conventional photo-sensor. With this graph, the effectiveness of the present invention has been proved.

Incidentally, upon adoption of the photo-sensor TFT 11, the source wirings D1 through Dm (one of the wirings in a lattice pattern; such as the one shown in FIG. 3), and the source/drain electrodes of the photo-sensor TFT 11 are preferably made on the same layer (by the same material) in order to simplify the manufacturing process of the TFT element; more specifically, it is preferable to form the source wirings D1 through Dm by a transparent conductive film (ITO). However, when forming an active matrix substrate having a large area and high-definition, the source wirings D1 through Dm have to have low resistance, and therefore, in some cases, the source wirings D1 through Dm are required to be made of a metal film having low resistance.

In such a case, the manufacturing may be carried out in such a manner that, firstly, the source wirings and source/drain electrodes are formed by a lamination film made of a transparent conductive film (such as an ITO) and a metal film (such as Ta, Ti, Mo), and then, the metal film as the upper layer is entirely or partly removed only from the source/drain electrodes of the photo-sensor TFT area. The photo-sensor TFT created through this process is shown in FIG. 6, FIGS. 7(*a*) and 7(*b*).

Figure 6:
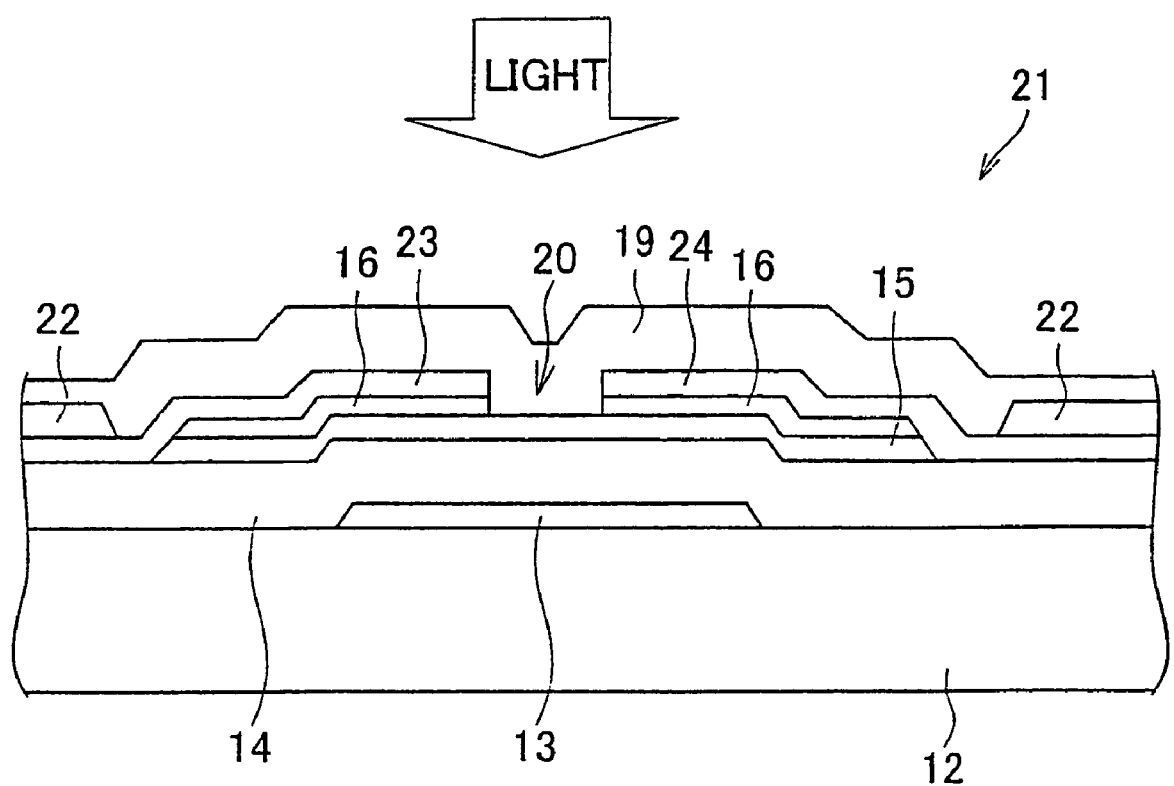
FIG. 6 is a cross sectional view schematically showing an arrangement of a thin film phototransistor as another example of the present invention.

FIG. 6 shows the structure of the photo-sensor TFT 21 in which a metal film 22 is removed so that a source electrode 23, a drain electrode 24 are both formed of a transparent conductive film in the whole of the TFT element area.

Figure 7:
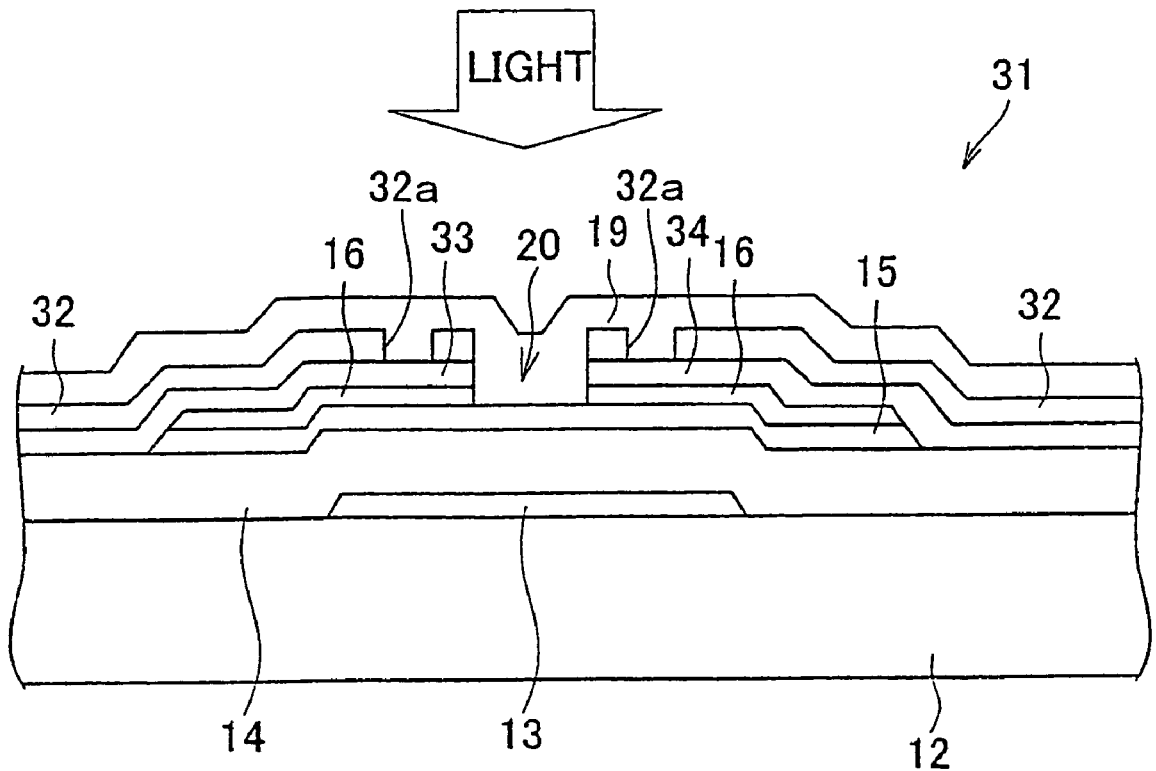
FIG. 7(a) is a cross sectional view schematically showing an arrangement of a thin film phototransistor as still another example of the present invention.
FIG. 7(b) is a plan view schematically showing an arrangement of a thin film phototransistor of FIG. 7(a).
Figure 7:
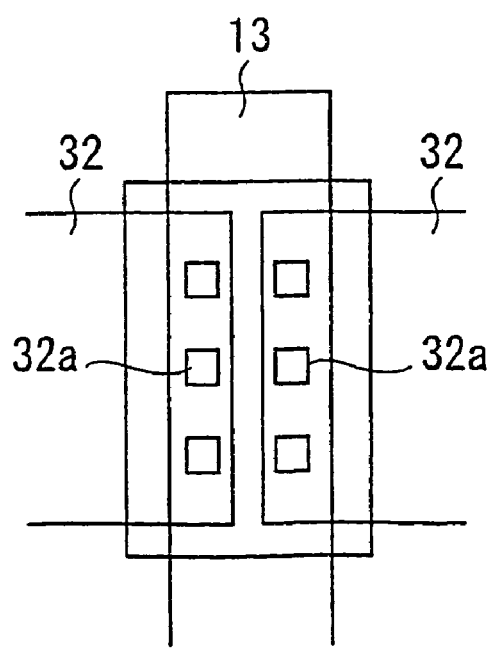

Further, FIGS. 7(*a*) and 7(*b*) show a photo-sensor TFT 31 in which a metal layer 32 is provided as an upper layer and an ITO as a transparent conductive oxide film is provided as a lower layer, and opening sections 32*a* are provided on the metal film 32 in the TFT element area, so as to provide translucent property to a portion of the source electrode 33 and a portion of the drain electrode 34 made of the ITO.

Figure 8:
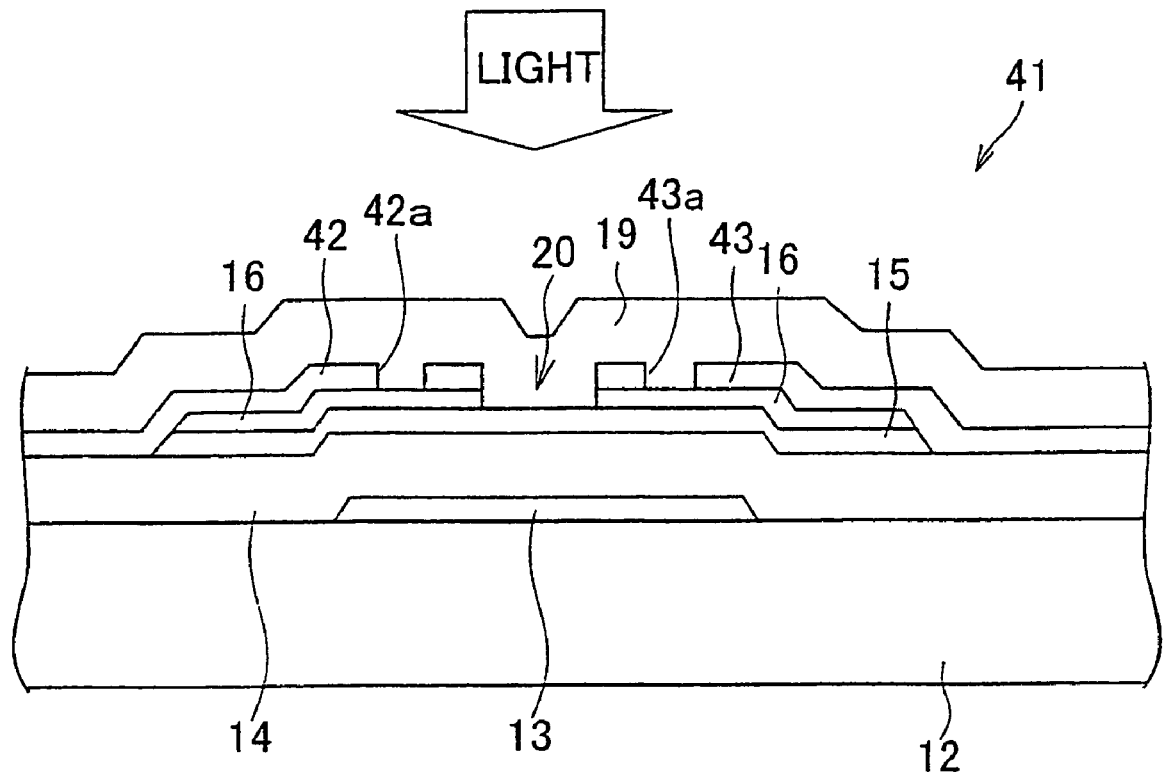
FIG. 8(a) is a cross sectional view schematically showing an arrangement of a thin film phototransistor as a further example of the present invention.
FIG. 8(b) is a plan view schematically showing an arrangement of a thin film phototransistor of FIG. 8(a).
Figure 8:
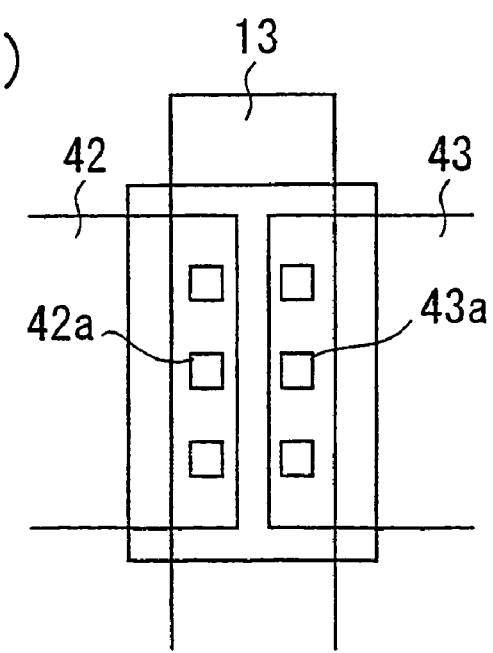

Further, as another allowable example, FIGS. 8(*a*) and 8(*b*) show a photo-sensor TFT 41 in which the source wirings, and the source/drain electrodes 42 and 43 are formed only by a metal film without a transparent conductive film (ITO), and opening sections 42*a* and 43*a* are provided on the metal film in the TFT element area, so as to provide translucent property to a portion of the source electrode 42 and a portion of the drain electrode 43.

Note that, in the photo-sensors TFT shown in FIGS. 7(*a*), 7(*b*), 8(*a*), and 8(*b*), the shape of the opening section provided on the metal film is not particularly limited, and it may be formed in a round shape, slit shape or the like according to the desired photosensitivity.

As has been described, the photo-sensor TFT of the present invention may be arranged in some different ways; however, the following factors are necessary to obtain the foregoing effects.

1) A gate electrode, a gate insulation film, a semiconductor film, a source electrode, and a drain electrode are provided.

2) The source electrode and the drain electrode respectively have superimposition areas to be horizontally superimposed on the gate electrode.

3) The source electrode and/or the drain electrode has translucency at least in one portion of the superimposition area.

Accordingly, the structure of the photo-sensor TFT is not limited to the ones shown in FIGS. 1, 6, FIGS. 7(*a*), 7(*b*) 8(*a*), and 8(*b*), and the same effects can be ensured in any structures satisfying the foregoing factors.

Note that, the present embodiment has described such an arrangement that the switching TFT 8 having a pixel selection function and a photo-sensor TFT 9 having a photo-sensing function are constituted by different TFT elements in the active matrix substrate 1; however, the present invention is also effective for a case where the pixel selection function and the photo-sensing function are provided by a single TFT element. The following Embodiment 2 deals with this arrangement.

Embodiment 2

The following will explain another embodiment of the present invention. Note that, as with Embodiment 1, the present embodiment uses a two-dimensional image sensor as an image scanning device.

Figure 9:
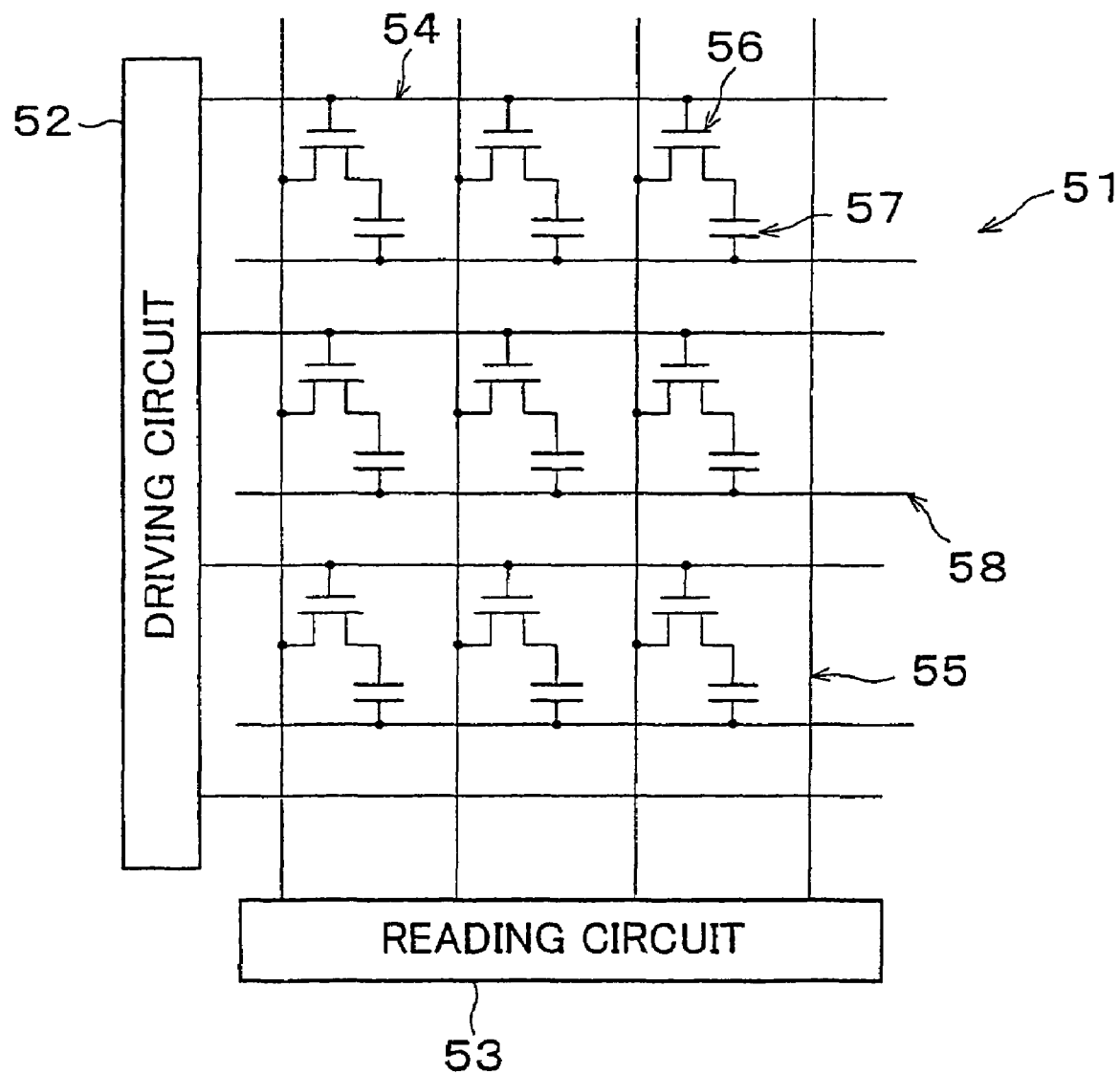
FIG. 9 is a block diagram schematically showing an active matrix substrate as another example of the present invention.

The following will describe the two-dimensional image sensor according to the present embodiment with reference to FIG. 9. FIG. 9 is a diagram showing a circuit arrangement of an active matrix substrate 51 constituting the two-dimensional image sensor.

As shown in FIG. 9, the active matrix substrate 51 differs from the active matrix substrate 1 described in Embodiment 1, and arranged so that one TFT element (thin film transistor) 56 is provided as a switching TFT and a photo-sensor TFT instead of providing both the switching TFT and the photo-sensor TFT for each pixel.

Accordingly, the active matrix substrate 51 has the same arrangement as that of the active matrix substrate 1 except that the thin film transistor 56 operates as a switching TFT having a pixel selection function and also as a photo-sensor TFT having a photo-sensor function. Thus, the explanation of structure equivalent to Embodiment 1 will be omitted here.

More specifically, in the active matrix substrate 51, the driving circuit 52 is the same as the driving circuit 4 of FIG. 3, the reading circuit 53 is the same as the reading circuit 5 of FIG. 3, the gate wiring 54 is the same as the gate wirings G1 through Gn of FIG. 3, and the source wiring 55 is the same as the source wirings D1 through Dm of FIG. 3. Note that, the active matrix substrate 51 shown in FIG. 9 includes a capacitor wiring 58 which is connected to a pixel capacitor 57 provided as a charge accumulation capacitor.

As shown in FIG. 9, the active matrix substrate 51 includes one thin film transistor 56 as a multifunction TFT and one pixel capacitor 57 for each pixel.

Figure 10:
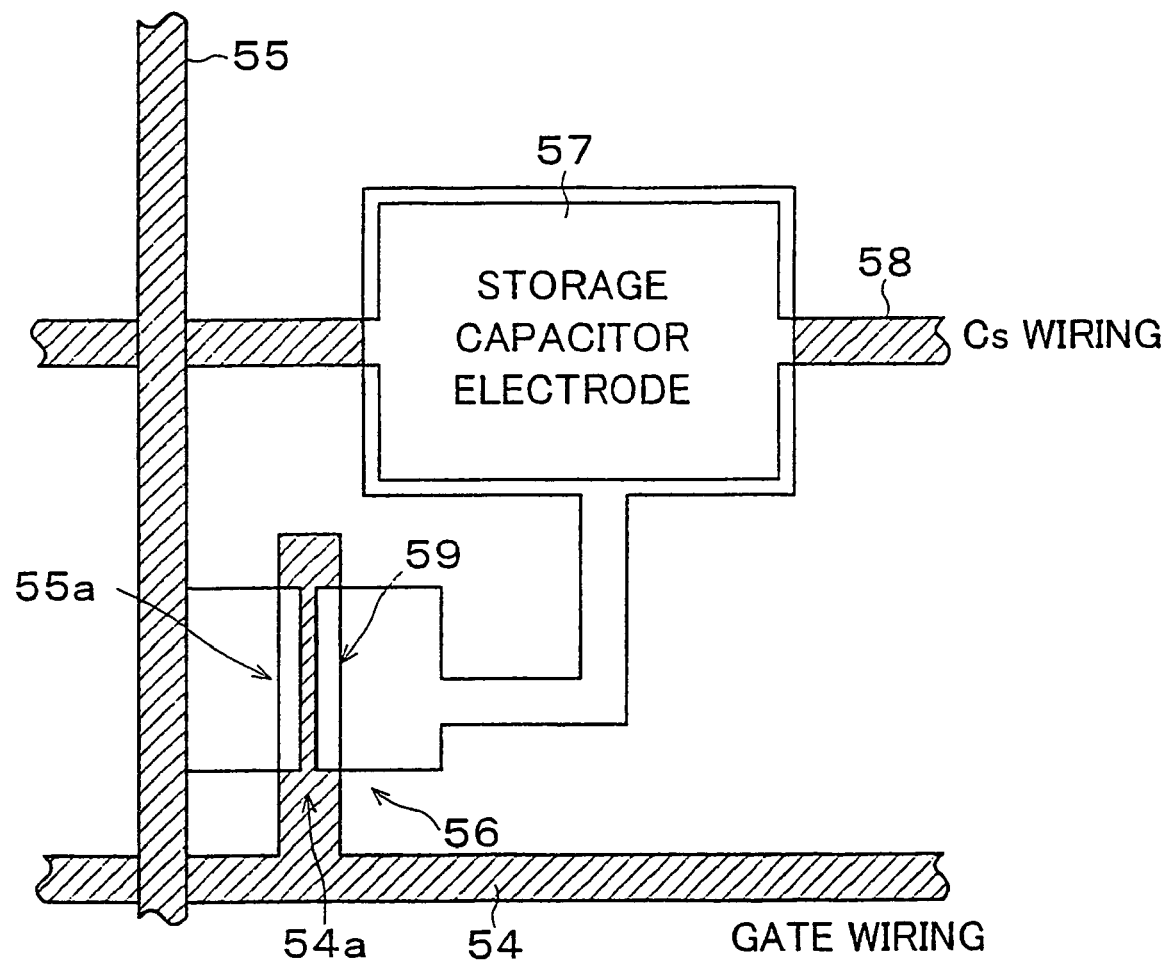
FIG. 10 is a drawing showing a pixel arrangement of the active matrix substrate shown in FIG. 9.

FIG. 10 shows a concrete plan layout for a pixel of the active matrix substrate 51. Also in this case, a source electrode 55a and a drain electrode 59 of the thin film transistor 56 are made of a transparent electrode. Thus, in the source electrode 55a and the drain electrode 59, the areas horizontally superimposed on the gate 54a have translucency.

Figure 11:
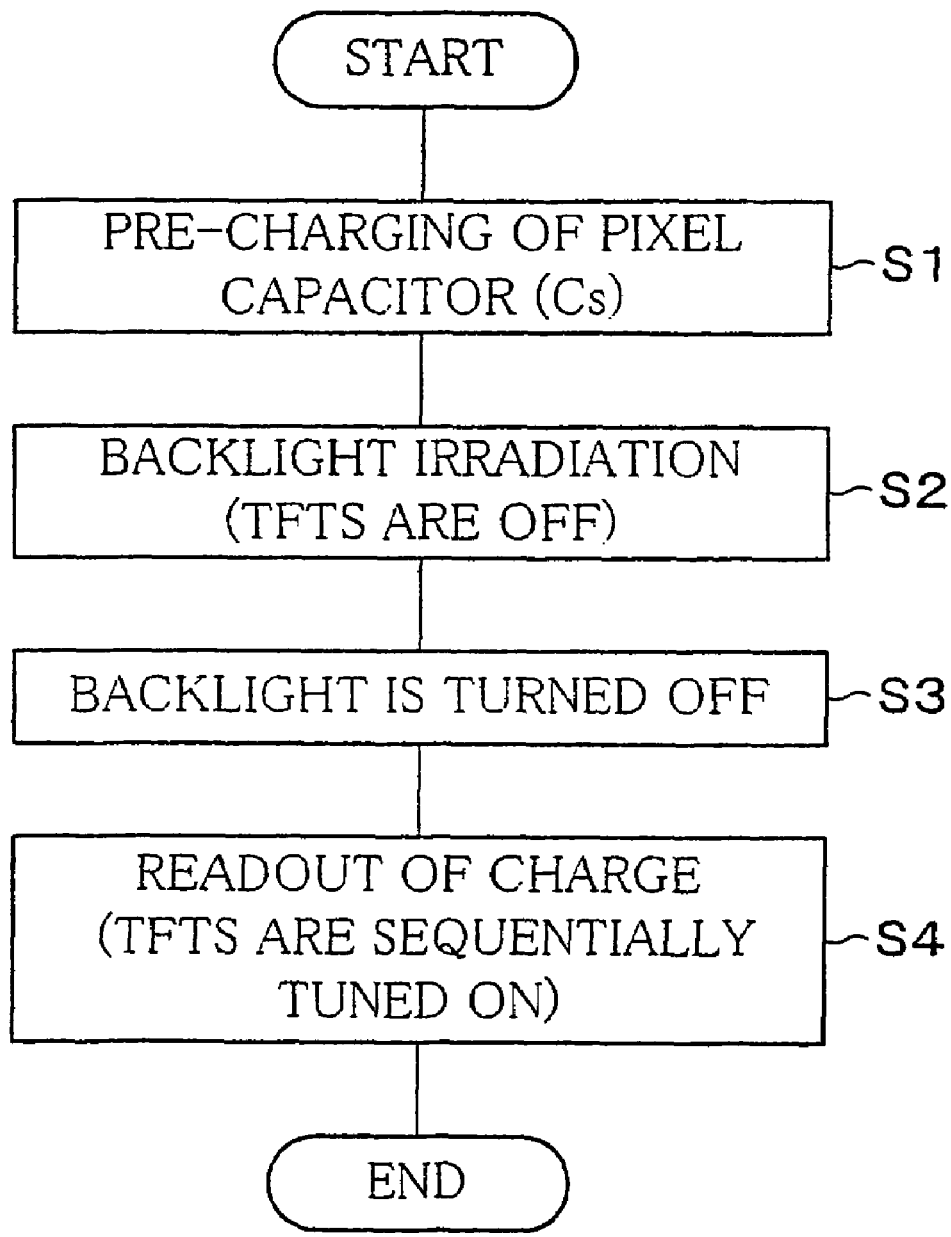
FIG. 11 is a flow chart showing a flow of image scanning operation of an image scanning device including the active matrix substrate shown in FIG. 9.

Here, with reference to FIGS. 10 and 11, the following will explain operation of the active matrix substrate 51 having the foregoing configuration. FIG. 11 is a flow chart showing readout sequence.

Firstly, the pixel capacitor (Cs) 57 is pre-charged (step S1). Here, the pixel capacitor (accumulation capacitor) 57 is pre-charged by using the source wiring 55 or the capacitor wiring 58. Note that, when pre-charging is performed by using the source wiring 55, the thin film transistor 56 has to be turned on.

Next, backlight irradiation is carried out (step S2). Here, the active matrix substrate 51 is irradiated with light (for example, reflection light of the document) for a predetermined time period by a backlight unit with the thin film transistor 56 tuned off. As a result, charge accumulated in the pixel capacitor 57 through the pre-charging is discharged due to the characteristic of a TFT shown in FIG. 5, i.e., such a characteristic that a current (the photo-current Ip) flowing between the source/drain electrodes increases in the area subjected to light irradiation. On the other hand, the charge accumulated in the pixel capacitor 57 is maintained in the area not subjected to light irradiation. Here, the thin film transistor 56 is used as the photo-sensor TFT.

Next, the backlight is turned off (step S3).

Then, readout of charge is carried out (step S4). More specifically, the light irradiation with respect to the active matrix substrate 51 is stopped, and readout of the charge remaining in the pixel capacitor 57 is carried out by sequentially turning on each thin film transistor 56 so as to read out plane distribution of the image information. Here, the thin film transistor 56 is used as a switching TFT.

Incidentally, as with Embodiment 1, it is also preferable in the present embodiment that the source wiring 55 (one of the wirings in a lattice pattern) shown in FIG. 9 and the source/drain electrodes of the thin film transistor 56 are made on the same layer (by a same material) in order to simplify the manufacturing process of the thin film transistor (TFT element). Therefore, it is preferable to use the photo-sensor TFT of the present invention, such as the ones described in Embodiment 1 above (i.e., the one shown in FIGS. 1, 6, 7(a), 7(b), 8(a), or 8(b)).

Further, as with Embodiment 1 above, a two-dimensional image scanning device can be realized by providing a protection film (or a protection substrate) on the front surface of an active matrix substrate having the foregoing photo-sensor TFT, and by placing a planar illuminant (a backlight constituted of an LED or a cathode-cold tube) on the rear surface of the active matrix substrate, and then by placing an object document such as a photo on the front surface (on the side having the protection film) of the active matrix substrate.

It follows from what has been said that both of the image scanning devices of Embodiment 1 and Embodiment 2 can provide high photosensitivity in the active matrix substrate, i.e., high photosensitivity in the thin film transistor constituting the active matrix substrate, thus realizing reduction of illuminance with respect to the active matrix substrate. On this account, power consumption of the backlight unit, i.e., light irradiating means for carrying out irradiation with respect to the active matrix substrate can be greatly reduced.

Further, because of high photosensitivity, the readout of the charge accumulated in the charge accumulation capacitor can be carried out at higher speed.

Accordingly, the present invention can realize an image scanning device capable of low power consumption (low illuminance for the backlight), and high speed readout.

Further, the present invention ensures high photosensitivity of the thin film transistor, and therefore when the increase of photosensitivity is suppressed, the size of the thin film phototransistor can be reduced. On this account, by using the same size of pixel capacitor, high-definition can be realized in the active matrix substrate.

Contrarily, by suppressing the increase of photosensitivity and using a smaller size thin film phototransistor with the same pixel density in the active matrix substrate, the size of the pixel capacitor can be increased.

On this account, since more charge is accumulated in the pixel capacitor, high accuracy is not required upon readout of the charge from the pixel capacitor, i.e., amplification by an amplifier, thus allowing the use of an amplifier lower in performance and cost.

Further, with the increase of size of the pixel capacitor, the amount of signal (amount of charge) read out from the pixel capacitor is increased, thus improving S/N of a signal from the amplifier. Therefore, even a low performance amplifier works sufficiently, and a lower cost two-dimensional image sensor can be provided.

Note that, Embodiments 1 and 2 above have explained a bottom-gate type element as the structure of the photo-sensor TFT; however., the present invention also allows the use of a top-gate type element. Further, there has been an example of adopting the photo-sensor TFT of the present invention to a two-dimensional active matrix array; however., the photo-sensor TFT may be used in a wide range as a one-dimensional sensor array or an independent photo-sensing element.

As described, a thin film phototransistor according to the present invention includes: a gate electrode; a gate insulation film provided on the gate electrode; a photosensitive semiconductor film laminated on the gate insulation film; a source electrode provided on the photosensitive semiconductor film; and drain electrode provided on the photosensitive semiconductor film, an end portion of the source electrode and an end portion of the drain electrode being separated with a predetermined distance, the source electrode and the drain electrode including a superimposition area for being horizontally superimposed on the gate electrode, and the superimposition area including at least one portion having translucency.

Accordingly, since the superimposition area of the source electrode and the drain electrode for being horizontally superimposed on the gate electrode including at least one portion having translucency, light irradiation quantity on the gate electrode is increased. More specifically, the photosensitive semiconductor film is irradiated with the light from the areas having translucency of the source electrode and the drain electrode as well as the light from the gap between the respective end portions of the source electrode and the drain electrode.

On this account, the photo-current (Ip) can be increased, and therefore photosensitivity (Ip/Id), which is found by the ratio of the photo-current to the dark current (Id), can be increased.

Further, the foregoing configuration does not require a complicated wiring, as it is realized only by providing translucency to a portion of the source electrode and the drain electrode. Also, the existing manufacturing process of the thin film transistor can be used without changes.

Therefore, the foregoing configuration of a thin film transistor realizes improvement of photosensitivity (Ip/Id) without causing complication of wiring layout or manufacturing process.

Further, when the phototransistor requires the same photosensitivity level as the conventional configuration, the size of the thin film phototransistor itself can be reduced, and therefore, pixel density of the active matrix substrate having the thin film transistor can be increased, thus realizing high-definition active matrix substrate.

Further, the thin film phototransistor according to the present invention may be arranged so that the portion having translucency is formed by a transparent conductive film in the source electrode and/or in the drain electrode. Further, it is preferable that the transparent conductive film is a transparent conductive oxide film. The transparent conductive oxide film can be an existing transparent conductive oxide film, such as an ITO (Indium Tin Oxide), an IZO (Indium Zinc Oxide) or an IGO (Indium Germanic Oxide). Therefore, the translucent areas of the source electrode and the drain electrode can be easily formed by an existing transparent conductive oxide film without a complicated manufacturing process.

Further, by forming the source wiring connected to the source electrode and the drain wiring connected to the drain electrode by the transparent conductive oxide film, it is possible to form the source wiring and the drain wiring by using the transparent conductive material in the manufacturing process of the thin film phototransistor, thereby more easily forming the translucent area.

Further, the thin film phototransistor according to the present invention may be arranged so that the source electrode and/or the drain electrode is formed by a metal film, and the area having translucency is formed by providing an opening section.

In this case, since the source electrode and/or the drain electrode is formed by a metal film, it is possible to form the source wiring connected to the source electrode and the drain wiring connected to the drain electrode by using the metal film, and therefore, the existing manufacturing process of the thin film phototransistor may be adopted without changes.

Further, the size of the opening section provided on the metal film may be decided according to the required photosensitivity, i.e., the required magnitude of the photo-current for the thin film phototransistor.

The following two active matrix substrates are possible examples of the active matrix substrate using the foregoing thin film transistor.

Namely, as described above, an active matrix substrate according to the present invention includes: electrical wirings in a form of a lattice pattern; a switching thin film transistor provided for each square of the lattice pattern and connected to the electric wirings; and a photo-sensor thin film transistor connected to the switching thin film transistor, the photo-sensor thin film transistor being made of the foregoing thin film phototransistor.

Further, as described above, an active matrix substrate according to the present invention includes: electrical wirings in a form of a lattice pattern; and a thin film transistor provided for each square of the lattice pattern and connected to the electric wirings, the thin film transistor having both a switching function and a photo-sensing function, the thin film transistor being made of the foregoing thin film phototransistor.

On this account, the photo-current (Ip) in the thin film-phototransistor can be increased, and therefore photosensitivity (Ip/Id), which is found by the ratio of the photo-current to the dark current (Id), can be increased.

Further, the foregoing configuration is realized only by providing translucency to at least one portion of the source electrode and/or the drain electrode so as to increase the photo-current, thus not requiring a complicated wiring or complicated manufacturing process for the photo-sensor thin film transistor.

Therefore, the use of the foregoing photo-sensor thin film transistor realizes an active matrix substrate capable of increasing photosensitivity with a simple configuration.

Further, the active matrix substrate according to the present invention may be arranged so that a drain electrode of the thin film phototransistor is connected to a charge accumulation capacitor.

In this case, since the photosensitivity of the thin film phototransistor is increased, the time constant for charging (or discharging) of the accumulation capacitor upon light irradiation can be reduced, thereby increasing scanning speed.

Further, in the foregoing thin film phototransistor, the same level photosensitivity as the conventional configuration can be ensured even when the size of the thin film phototransistor is reduced. On this account, by using the same size of active matrix substrate, it is possible to enlarge the size of the charge accumulation capacitor connected to the drain electrode of the thin film transistor.

On this account, since more charge is accumulated in the charge accumulation capacitor, it is not necessary to use a high accuracy amplifier for amplifying the charge read out from the charge accumulation capacitor.

More specifically, with the increase of size of the charge accumulation capacitor, the amount of signal (amount of charge) read out from the charge accumulation capacitor is increased, thus improving S/N of a signal from the amplifier. Therefore, even a low performance amplifier sufficiently works in this configuration.

Therefore, when the active matrix substrate having the foregoing configuration is adopted for an image scanning device, even a low accuracy amplifier of low-cost can work for amplifying the charge readout from the charge accumulation capacitor, thereby reducing manufacturing cost of the image scanning device.

Further, the active matrix substrate according to the present invention may be arranged so that the electric wirings in a form of a lattice pattern include a wiring connected to a source electrode of the thin film phototransistor., and the wiring is made of a transparent conductive film and formed on a same layer as that on which the source electrode is formed.

With this arrangement, the source electrode having translucency and the source wiring connected to the source electrode may be simultaneously formed, thereby simplifying manufacturing process.

Further, the active matrix substrate according to the present invention may be arranged so that the electric wirings in a form of a lattice pattern include a wiring connected to a source electrode of the thin film phototransistor, and the wiring is made of a transparent conductive film and a metal film, and the transparent conductive film is formed on a same layer as that on which the source electrode is formed.

With this arrangement, since the source wiring is formed by a metal film, the wiring resistance becomes lower than the source wiring formed by a transparent conductive film. Therefore, it is possible to realize upsizing or higher definition of the active matrix substrate.

Further, the foregoing active matrix substrate is used for a two dimensional image scanning device.

In this case, since the image scanning device includes the active matrix substrate of the present invention, image scanning sensitivity can be improved.

Further, the foregoing image scanning device may further includes light irradiating means for carrying out light irradiation with respect to the active matrix substrate, the light irradiating means being provided on a side opposite to a side for image scanning of the active matrix substrate.

With this arrangement, since the active matrix substrate includes a thin film phototransistor having high photosensitivity, the light illuminance for image scanning by the light irradiating means can be reduced. Therefore, power consumption of the light irradiating means can be reduced, thereby reducing the whole power consumption throughout the image scanning device.

For a fuller understanding of the nature and advantages of the invention, reference should be made to the ensuing detailed description taken in conjunction with the accompanying drawings.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

As described, the thin film phototransistor according to the present invention is suitable for realizing simplification of manufacturing process and wiring layout, and also suitable for improvement of photosensitivity (Ip/Id).

Further, when the phototransistor requires the same photosensitivity level as the conventional configuration, the size of the thin film phototransistor itself can be reduced, and therefore, pixel density of the active matrix substrate having the thin film transistor can be increased, for example. Namely, the thin film phototransistor is suitable for realizing high-definition active matrix substrate.

The invention claimed is:

1. A thin film phototransistor, comprising:
   a gate electrode;
   a gate insulation film provided on the gate electrode;
   a photosensitive semiconductor film laminated on the gate insulation film;
   a source electrode provided on the photosensitive semiconductor film; and
   a drain electrode provided on the photosensitive semiconductor film,
   an end portion of the source electrode and an end portion of the drain electrode being separated with a predetermined distance,
   the source electrode and/or the drain electrode including a superimposition area horizontally superimposed on the gate electrode, and the superimposition area including at least one portion having translucency, wherein photoexcitation carriers are generated in the gap formed between the source and drain electrodes and the superimposition areas of both the source and drain electrodes.

2. The thin film phototransistor as set forth in claim 1, wherein:
   the portion having translucency is formed by a transparent conductive film in the source electrode and/or in the drain electrode.

3. The thin film phototransistor as set forth in claim 2, wherein: the transparent conductive film is a transparent conductive oxide film.

4. The thin film phototransistor as set forth in claim 1, wherein: the source electrode and/or the drain electrode is formed by a metal film, and the portion having translucency is formed by providing an opening section.

5. An active matrix substrate, comprising:
   electrical wirings in a form of a lattice pattern;
   a switching thin film transistor provided for each square of the lattice pattern and connected to the electric wirings; and
   a photo-sensor thin film transistor connected to the switching thin film transistor, the photo-sensor thin film transistor being made of the thin film phototransistor as set forth in claim 1.

6. An active matrix substrate, comprising:
   electrical wirings in a form of a lattice pattern; and
   a thin film transistor provided for each square of the lattice pattern and connected to the electric wirings, the thin film transistor having both a switching function and a photo-sensing function, the thin film transistor being made of the thin film phototransistor as set forth in claim 1.

7. The active matrix substrate as set forth in claim 5, wherein:
   a drain electrode of the thin film phototransistor is connected to a charge accumulation capacitor.

8. The active matrix substrate as set forth in claim 5, wherein:
   the electric wirings in a form of a lattice pattern include a wiring connected to a source electrode of the thin film phototransistor, and the wiring is made of a transparent conductive film and formed on a same layer as that on which the source electrode is formed.

9. The active matrix substrate as set forth in claim 8, wherein:
   the transparent conductive film is a transparent conductive oxide film.

10. The active matrix substrate as set forth in claim 5, wherein:
    the electric wirings in a form of a lattice pattern include a wiring connected to a source electrode of the thin film phototransistor, and the wiring is made of a transparent conductive film and a metal film, and the transparent conductive film is formed on a same layer as that on which the source electrode is formed.

11. The thin film phototransistor as set forth in claim 10, wherein:
    the transparent conductive film is a transparent conductive oxide film.

12. An image scanning device, comprising:
    the active matrix substrate as set forth in claim 5, as a two dimensional image scanning element.

13. The image scanning device as set forth in claim 12, further comprising:
    light irradiating devices for carrying out light irradiation with respect to the active matrix substrate, the light irradiating devices being provided on a side opposite to a side for image scanning of the active matrix substrate.

* * * * *